(12) United States Patent
Huang et al.

(10) Patent No.: US 7,179,664 B2
(45) Date of Patent: Feb. 20, 2007

(54) METHOD FOR GENERATING WORK-IN-PROCESS SCHEDULES

(75) Inventors: Shu Chen Huang, Hsin-Chu (TW); Gwo-Chiang Fang, Pingihen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 231 days.

(21) Appl. No.: 10/840,099

(22) Filed: May 6, 2004

(65) Prior Publication Data
US 2005/0250226 A1 Nov. 10, 2005

(51) Int. Cl.
*H01L 31/26* (2006.01)

(52) U.S. Cl. .......................................... 438/14; 700/97

(58) Field of Classification Search ................. 438/14; 700/97, 100
See application file for complete search history.

(56) References Cited

U.S. PATENT DOCUMENTS 6,438,436 B1 * 8/2002 Hohkibara et al. ........... 700/97

\* cited by examiner

*Primary Examiner*—Andy Huynh
*Assistant Examiner*—Thinh T. Nguyen
(74) *Attorney, Agent, or Firm*—Duane Morris LLP

(57) ABSTRACT

A method and program is disclosed for generating work in progress (WIP) schedules in semiconductor manufacturing facility. After determining starting and ending dates of predetermined schedule periods for generating WIP schedules, remaining days are determined for completing at least one wafer lot associated with predetermined product from the starting date. A starting process stage for the wafer lot is determined at the starting date based on the remaining days, and an ending process stage for the wafer lot at the end of the ending date. Wafer numbers are assigned to each process stage of schedule times in proportion to process times of each stage in view of total process time for the schedule period, and by repeating the above steps for one or more other wafer lots under production, a total wafer number assigned to each stage is determined and the WIP schedule for the schedule period is obtained.

7 Claims, 2 Drawing Sheets

METHOD FOR GENERATING WORK-IN-PROCESS SCHEDULES

BACKGROUND

This invention relates to semiconductor fabrication and, more particularly, to methods for planning operations within semiconductor fabrication facilities.

In a large manufacturing facility, such as a semiconductor foundry in which many tools are required to build the wafer and chip product, there are complex programs that run the tools that require monitoring and control to guide manufacturers in the way these programs may be implemented. The main framework for this system is known as the Computer Implemented Manufacturing (CIM) framework.

The overall control of the foundry floor is by a central server having a Manufacturing Execution System (MES) with tool control system. The central server has the information on each customer job that is currently being processed and ensures that each tool in sequence is performing the correct operation. This server communicates with users who monitor and control the production flow and operations on client workstations.

Standard work-in-progress (WIP) profiles or schedule, by process stage, are one of the items that manufacturing personnel and managers would like to know most. Even though WIP profiles are popular, there is no systematic method to generate a WIP profile in a timely and consistent manner. One problem with generating WIP profiles is that a significant amount of data about process time and cycle time factor must be collected, organized, correlated, and maintained. Maintaining, let alone collecting and correlating, this information in a timely manner requires significant resources and support by Fabrication Plant and Information Technology personnel.

Desirable in the art of is a need for a method and system for timely determining WIP profiles to allow for efficient operation of semiconductor foundries in order to maximize the capacity of the manufacturing facility.

SUMMARY

In view of the foregoing, this invention provides a method and program for generating a work in progress (WIP) schedule in a semiconductor manufacturing facility.

In one embodiment, after determining the starting and ending dates of a predetermined schedule period for generating the WIP schedule, remaining days are determined for completing at least one wafer lot associated with a predetermined product from the starting date. A starting process stage for the wafer lot is determined at the beginning of the starting date based on the remaining days, as well as an ending process stage for the wafer lot at the end of the ending date. Wafer numbers are assigned to each process stage of the schedule time in proportion to a process time of each stage in view of a total process time for the schedule period; and, by repeating the above steps for one or more other wafer lots under production, a total wafer number assigned to each stage is determined and the WIP schedule for the schedule period is obtained.

The construction and method of operation of the invention together with additional objects and advantages thereof will be best understood from the following description of specific embodiments when read in connection with the accompanying drawings.

DESCRIPTION

Figure 1:
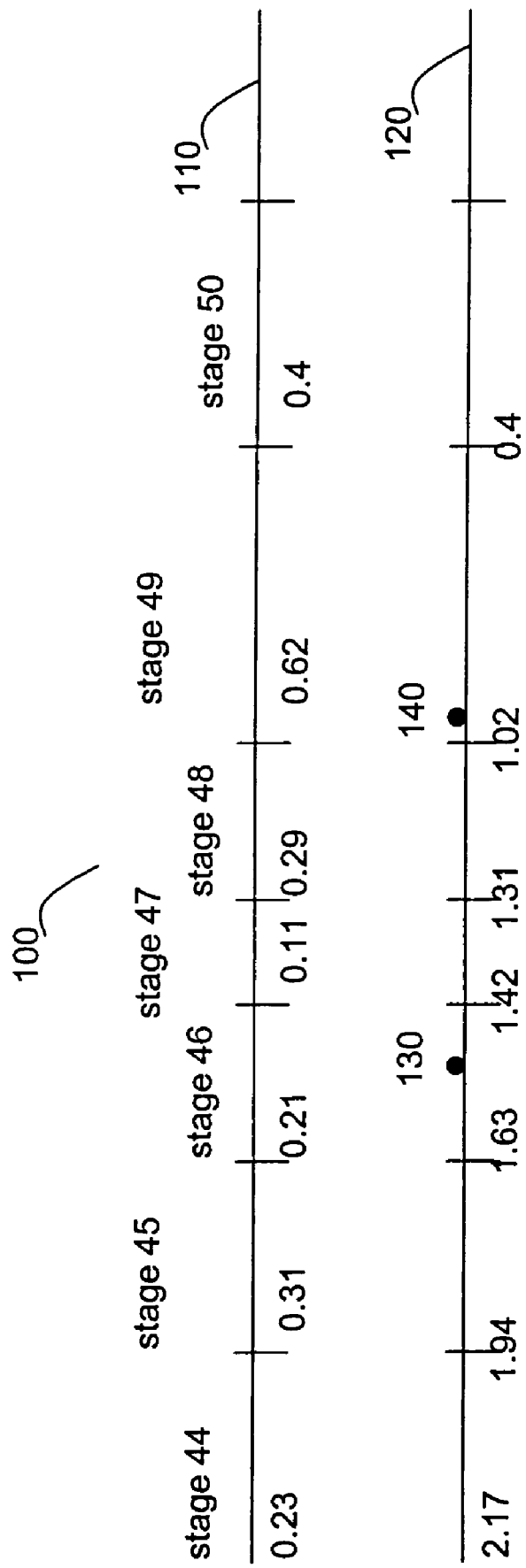
FIG. 1 presents a diagram illustrating wafer process time with respect to each process stage and relevant time lines in accordance with one embodiment of the present invention.

The following is a detailed description of an improved method for generating WIP schedules so that a manufacturing facility can maximize its capacity in accordance with the present invention. The disclosed method assigns wafer numbers to each stage of the manufacturing based on process time needed for each stage.

In semiconductor manufacturing, an order of certain products needs to be started from blank wafers, and goes through various stages of processes in the manufacturing process. In a manufacturing facility, a large number of orders are going through various stages of the facility at any time, and it is noted that an order may be split into multiple wafer lots.

In planning semiconductor fabrication, information may be collected or drawn from a Management Executive System (MES) which may be a commercially available or a user-generated software package suitable for retaining and maintaining information items associated with semiconductor fabrication, such recipes, process steps, etc. The data may be provided to a planning software for creating the production schedule, e.g., the WIP schedule, for fabrication of the semiconductor products wafers. The resultant plan or schedule may include information regarding, for embodiment, forecast of how many wafers should be manufactured for each stage of the fabrication process, and may also include other production related information about material consumption, mask requirements, etc.

Table I below illustrates that an order or a batch of product having part identifier (ID) A goes through processing stages 44 through 50 for its entire manufacturing time period. Also listed is the net processing time needed in each stage, and the corresponding accumulative process time as the wafers go through the flow.

TABLE I

| Part ID | Stage_ID | Stage Order | Process Time (Days) | Accumulated Process Time (Days) |
| --- | --- | --- | --- | --- |
| A | Stage_50 | 50 | 0.40 | 0.4 |
| A | Stage_49 | 49 | 0.62 | 1.02 |
| A | Stage_48 | 48 | 0.29 | 1.31 |
| A | Stage_47 | 47 | 0.11 | 1.43 |
| A | Stage_46 | 46 | 0.21 | 1.64 |
| A | Stage_45 | 45 | 0.31 | 1.95 |
| A | Stage_44 | 44 | 0.23 | 2.17 |

As it is understood, that, although the net total accumulative process time is about 2.17 days, but due to the production reality, it is usually scheduled for more time for the entire manufacturing process. For embodiment, the total time scheduled can be 3 days. The relation between the total time scheduled and the net total accumulative process time can be mathematically represented by a ratio referred to as an X ratio for this invention:

$X$=Total Scheduled Time/Total Accumulative Process Time

It is further noted although mathematical representations are made above in Table I with regard to each stage, it is understood that once a process starts in any stage, it has to finish and cannot instantly stop at any arbitrary time.

When generating a WIP schedule, it is usually done on a daily basis during the production process. Since the schedule can change every day, the WIP scheduling can be done multiple times on an as-needed basis. Further, one or more computing devices can be used for processing information to generate the WIP schedule.

FIG. 1 illustrates, graphically, time schedules of the process flow 100 for a particular product. In this exemplary case, the net process time associated with each stage_ID shown in Table I is depicted sequentially along a linear time line 110. The net process time associated with each stage_ID is further shown underneath each stage. FIG. 1 further illustrates the association of a remaining process time line 120 with respect to each stage as the process flow progresses. For embodiment, at the beginning of a starting stage 44, total 2.17 days are remaining for finishing the flow, and similarly, at the end of stage 44, 1.94 days are left.

When generating a WIP schedule for a coming day, it is first determined which stage the process flow shall be started for the day. The due date for completing the product is also determined. It then can be calculated how many days are left for production. For embodiment, if the due date is Jul. 4, 2004, and it is Jul. 2, 2004, that needs a WIP schedule. There are total 3 remaining days for processing. Using the X ratio, it can be obtained that the process should start at point 3/2=1.5 on the process time line 120. This point is identified as point 130. As it is described above, the stages of processes are discrete in nature, and the identified point 130 only indicates that the process should start from the next stage, e.g., stage 47.

Once the starting stage for the day is determined, the ending stage also needs to be determined. At the end of Jul. 2, 2004, there are only 2 days remaining so that 2 divided by the X ration is to get 1 reflected by point 140 on the time line 120, which is stage 49. It is further determined that the total daily process time for these three stages is 0.11+0.29+0.62=1.02 days. Now, it is all determined how many stages the WIP schedule should cover for the day under scheduling. Wafer numbers need to be assigned to each stage for scheduling WIP purpose. Assuming the same product has a plurality of wafer lots going through the production flow and each wafer lot may have different number of wafers. Assuming a wafer lot has 50 wafers, the wafers are distributed in proportion to the net process time with respect to the total daily process time. In this particular embodiment, for stage 47, 50×0.11/1.02=5.39 wafers should be assigned. This process should be repeated for all wafer lots involved for the product to get a total number of wafers assigned for stage 47. Since wafers cannot be divided, the total number of wafers has to be rounded. For embodiment, 15.39 wafers have to be rounded to 15 or 16 wafers based a rounding convention. As such, a WIP schedule for the product for the predetermined day is generated. When every wafer lot is considered for the product, the scheduling may extend to other products as well so that the total usage of each stage can also be identified.

Figure 2:
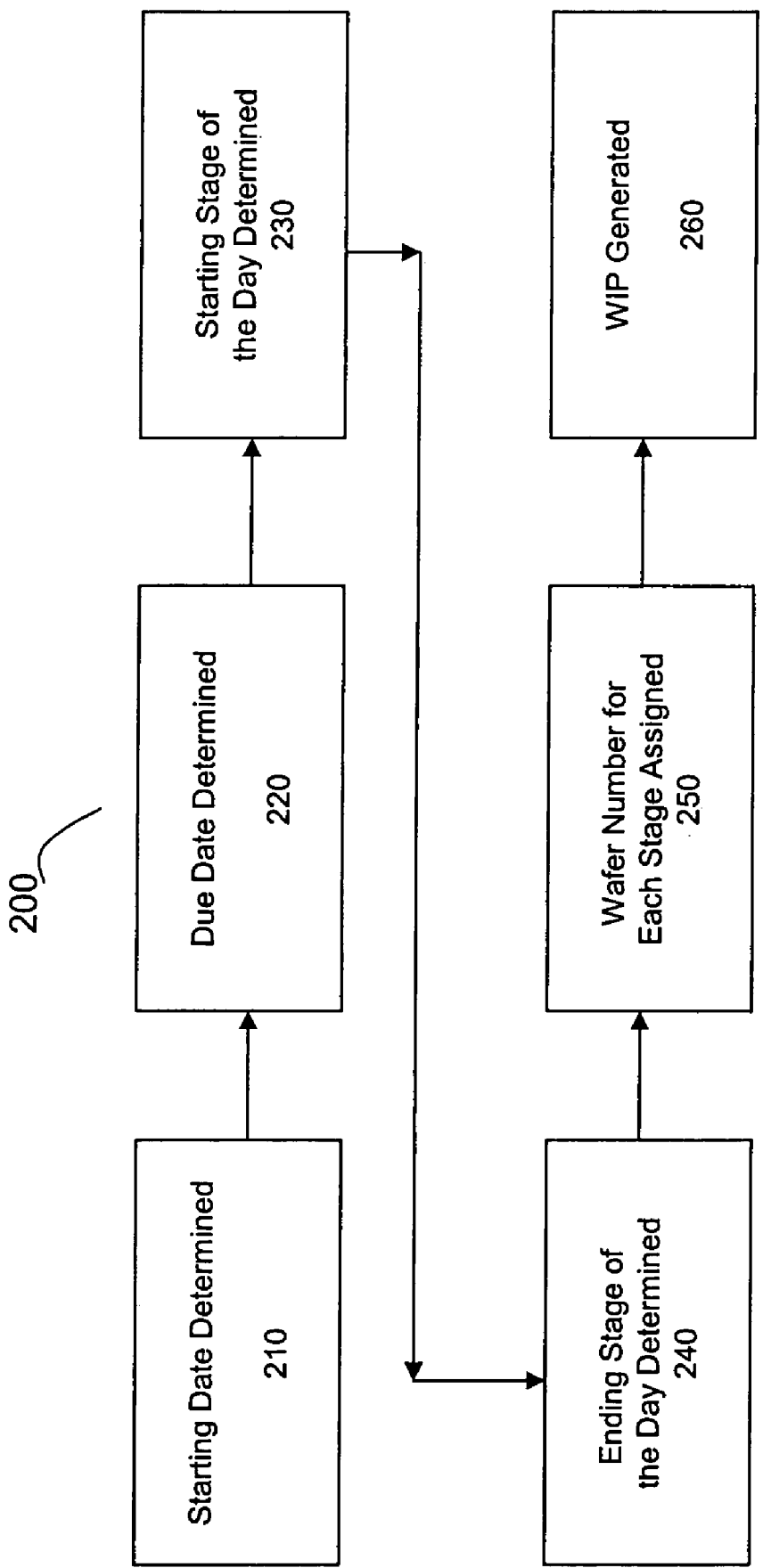
FIG. 2 illustrates a flow diagram for detailed steps for generating the WIP schedule in accordance with one embodiment of the present invention.

FIG. 2 illustrates a process 200 for determining a WIP schedule in accordance with one embodiment of the present invention. In step 210, a starting date to be scheduled is obtained as determined by the user. Although the embodiments illustrated above or below use a daily WIP schedule for illustration, the WIP schedule can be set for any length of time. For embodiment, if a work flow takes a month, a high level weekly WIP may be scheduled in addition to daily schedules.

Assuming only daily WIP is needed, in step 220, a due date is obtained. In step 230, the starting stage of the day is determined based on a cycle time factor, referred to as the "X ratio," and the total days remaining for the process flow. The X ratio helps to scale the remaining days so that a time point can be identified on the remaining time line as illustrated in FIG. 1. Alternatively, the starting stage can be determined based on the ending stage of the day immediately previous to the day under scheduling. In step 240, the ending stage of the day is also determined. When all the process stages are identified for the day, the total number of wafers in wafer lots for predetermined products are used for determining the number of wafers assigned to each stage based on the net process time of each stage with respect to the total daily process time. The WIP schedule is now completed (step 260) and various reports can be generated.

Such a WIP generating process can be implemented using computer processing tools. Software programs can be developed to provide instructions and interfaces for generating the WIP schedule. The platform for developing such a software can be chosen based on the software environment of the existing manufacturing facility. One skilled in the art can understand that the above described functions for generating the WIP schedule can be developed using various software tools. With the networking technology in existence today, the WIP schedule can be generated, viewed, modified, or otherwise controlled by authorized users.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, DVDs, hard drives, ZIP™ disks, memory sticks, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

While the invention has been described with reference to the preferred embodiments thereof, it will be appreciated by those of ordinary skill in the art that modifications can be made to the parts that comprise the invention without departing from the spirit and scope thereof, as defined by the claims. It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A method for generating a work in progress (WIP) schedule in a semiconductor manufacturing facility, the method comprising:

determining starting and ending dates of a predetermined schedule period for generating the WIP schedule;

determining remaining days for completing at least one wafer lot associated with a predetermined product from the starting date;

determining a starting process stage for the wafer lot at the beginning of the starting date based on the remaining days;

determining an ending process stage for the wafer lot at the end of the ending date;

identifying all stages between the starting and the ending process stages;

assigning wafer numbers to each process stage of the schedule time in proportion to a process time of each stage in view of a total process time for the schedule period; and repeating the above steps for one or more other wafer lots under production to determine a total wafer number assigned to each stage, thereby constructing the WIP schedule for the schedule period, wherein at least one of the above steps is performed through a computing device.

2. The method of claim 1 wherein the starting date and the ending date are the same.

3. The method of claim 1 wherein determining a starting process stage further includes:

identifying a process time for each process stage to complete the wafer lot;

identifying a remaining process time line indicating remaining time for completing the wafer lot; and identifying the starting process stage along the remaining process time line based on the determined remaining days and a total process time for completing the wafer lot.

4. The method of claim 3 wherein identifying the starting process stage further includes:

scaling the remaining days by a cycle time factor to obtain a time point; and determining the starting process stage by identifying the time point along the remaining process time line.

5. The method of claim 1 further comprises generating one or more WIP schedules for one or more additional products for one or more process stages.

6. The method of claim 1 wherein determining a starting process stage further includes:

identifying a process time for each process stage to complete the wafer lot;

identifying a remaining process time line indicating remaining time for completing the wafer lot; and identifying the starting process stage along the remaining process time line based on the determined remaining days and a total process time for completing the wafer lot.

7. The method of claim 6 wherein identifying the starting process stage further includes:

scaling the remaining days by a cycle time factor to obtain a time point; and determining the starting process stage by identifying the time point along the remaining process time line.

* * * * *